United States Patent
Kiefer et al.

(10) Patent No.: US 10,705,172 B2
(45) Date of Patent: Jul. 7, 2020

(54) MAGNETIC RESONANCE APPARATUS AND METHOD FOR DYNAMIC ADJUSTMENT THEREOF WITH MULTIPLE ADJUSTMENT PARAMETERS

(71) Applicant: Siemens Healthcare GmbH, Erlangen (DE)

(72) Inventors: Berthold Kiefer, Erlangen (DE); Alto Stemmer, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 344 days.

(21) Appl. No.: 15/441,288

(22) Filed: Feb. 24, 2017

(65) Prior Publication Data

US 2017/0242089 A1 Aug. 24, 2017

(30) Foreign Application Priority Data

Feb. 24, 2016 (DE) .......................... 10 2016 202 884

(51) Int. Cl.
*G01R 33/565* (2006.01)
*G01R 33/54* (2006.01)
(Continued)

(52) U.S. Cl.
CPC ..... *G01R 33/56563* (2013.01); *G01R 33/443* (2013.01); *G01R 33/543* (2013.01);
(Continued)

(58) Field of Classification Search
USPC .......................... 324/300–322; 600/407–435; 382/128–131
See application file for complete search history.

(56) References Cited

U.S. PATENT DOCUMENTS 8,842,896 B2 * 9/2014 Hajnal .................. A61B 5/055
382/131
9,940,540 B2 * 4/2018 Koehler .................. G06K 9/52
(Continued)

OTHER PUBLICATIONS

Kadah et al., "Algebraic Reconstruction for Magnetic Resonance Imaging Under $B_0$ Inhomogeneity," IEEE Transactions on Medical Imaging, vol. 17, No. 3, pp. 362-370 (1998).
(Continued)

*Primary Examiner* — Dixomara Vargas
(74) *Attorney, Agent, or Firm* — Schiff Hardin LLP

(57) ABSTRACT

In a method and magnetic resonance (MR) apparatus for performing an adjustment of the MR system, an examination object under is divided into at least one excitation volume. First adjustment parameters for the at least one excitation volume of the object, and second adjustment parameters for the at least one excitation volume of the object, which differ from the first adjustment parameters are determined. First MR signals are acquired from the at least one excitation volume using the first adjustment parameters. Second MR signals are acquired from an excitation volume using the second adjustment parameters. A first MR image of the at least one excitation volume is reconstructed using the first MR signal. A second MR image of the at least one excitation volume is reconstructed using the second MR signal.

18 Claims, 4 Drawing Sheets

(51) Int. Cl.
*G01R 33/44* (2006.01)
*G01R 33/56* (2006.01)
*G01R 33/561* (2006.01)
*G01R 33/483* (2006.01)

(52) U.S. Cl.
CPC ..... *G01R 33/5608* (2013.01); *G01R 33/5616* (2013.01); *G01R 33/4838* (2013.01)

(56) References Cited

U.S. PATENT DOCUMENTS

| | | | | |
|---|---|---|---|---|
| 10,191,126 | B2* | 1/2019 | He | G01R 33/246 |
| 2007/0145975 | A1* | 6/2007 | Feiweier | G01R 33/583 |
| | | | | 324/307 |
| 2007/0279060 | A1 | 12/2007 | Dannels et al. | |
| 2010/0329528 | A1* | 12/2010 | Hajnal | A61B 5/055 |
| | | | | 382/131 |
| 2013/0293230 | A1* | 11/2013 | Schneider | G01R 33/4833 |
| | | | | 324/309 |
| 2014/0002077 | A1* | 1/2014 | Deshpande | G01R 33/56 |
| | | | | 324/309 |
| 2015/0346309 | A1 | 12/2015 | Campagna et al. | |
| 2015/0355306 | A1 | 12/2015 | Stemmer | |
| 2016/0274205 | A1 | 9/2016 | Stemmer | |
| 2017/0089996 | A1* | 3/2017 | Feiweier | G01R 33/4835 |
| 2017/0242089 | A1* | 8/2017 | Kiefer | G01R 33/443 |

OTHER PUBLICATIONS

Jezzard et al., "Correction for Geometric Distortion in Echo Planar Images from $B_0$ Field Variations," Magnetic Resonance in Medicine, vol. 34, pp. 65-73 (1995).

Blamire et al., "Dynamic Shim Updating: A New Approach Towards Optimized Whole Brain Shimming," Magnetic Resonance in Medicine, vol. 36, pp. 159-165 (1996).

Morrell et al., "Dynamic Shimming for Multi-Slice Magnetic Resonance Imaging," Magnetic Resonance in Medicine, vol. 38, pp. 477-483 (1997).

* cited by examiner

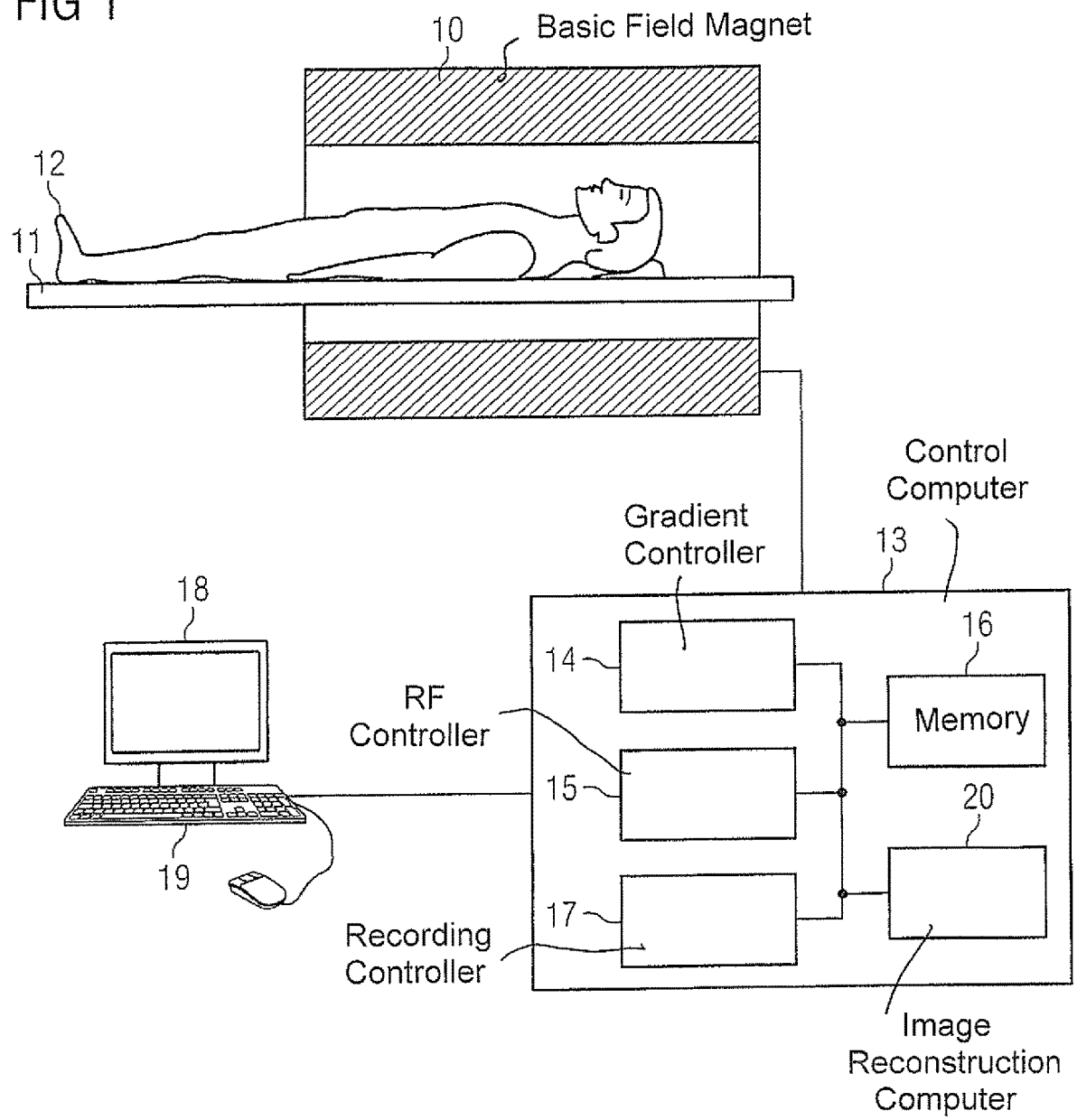

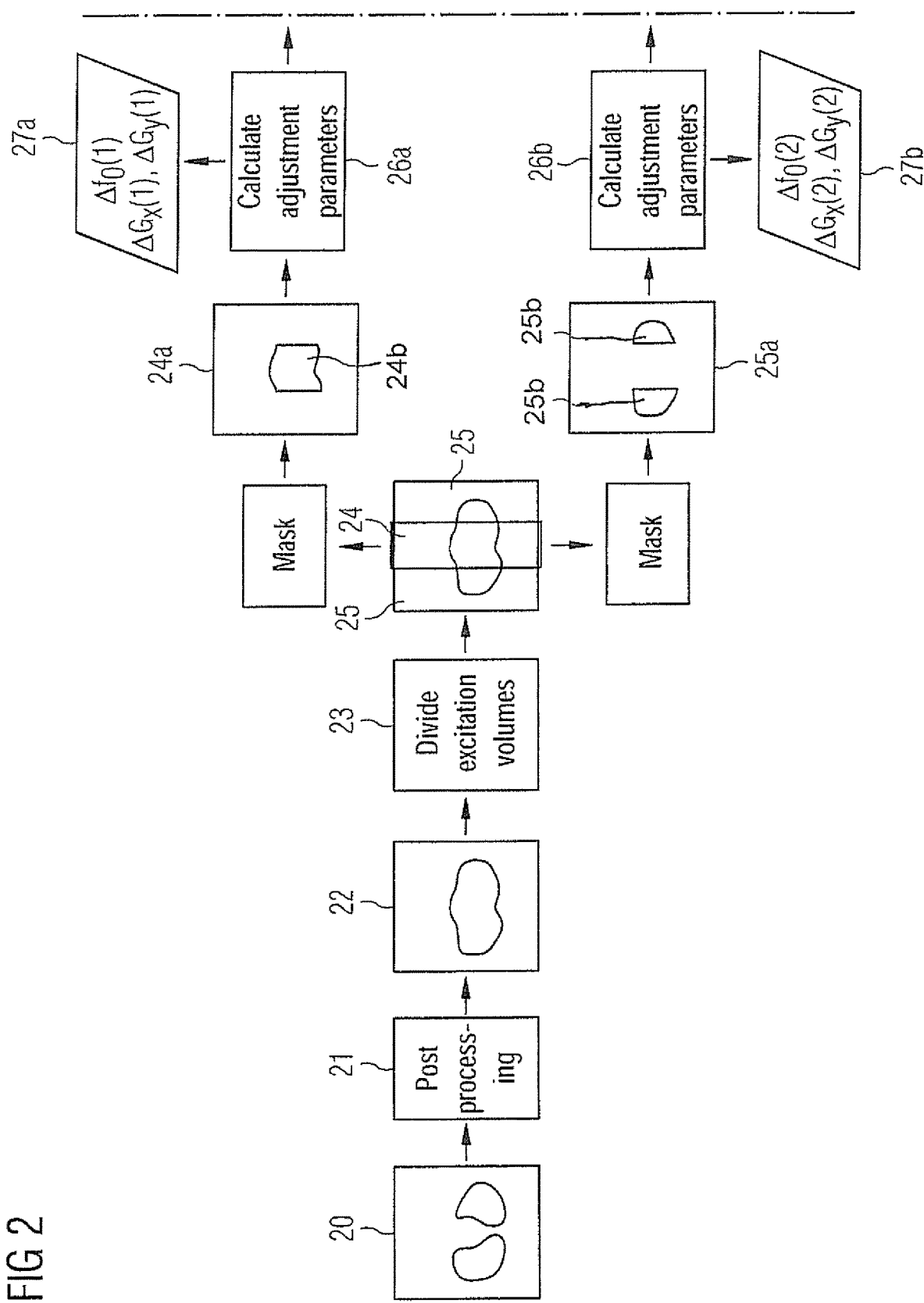

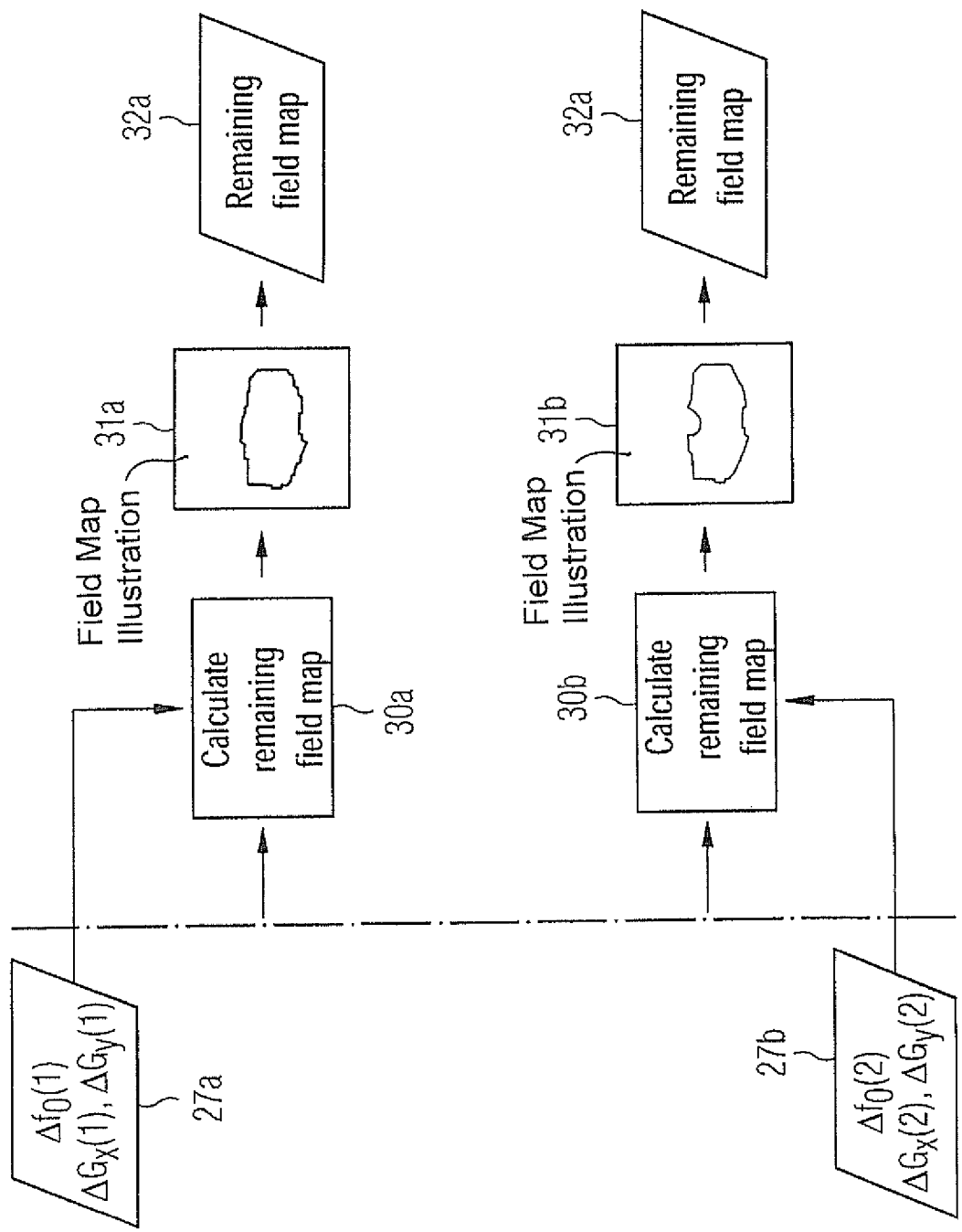

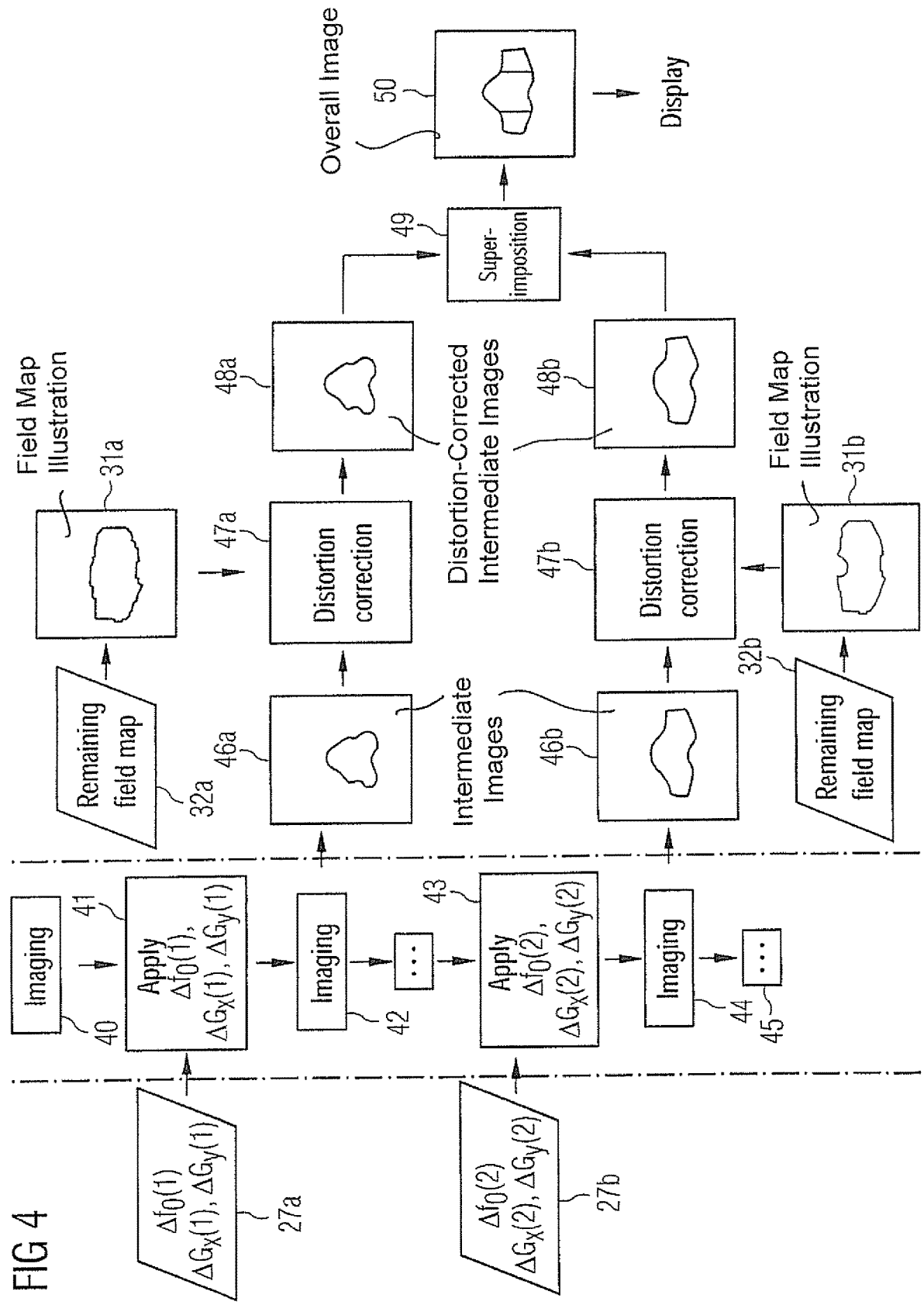

MAGNETIC RESONANCE APPARATUS AND METHOD FOR DYNAMIC ADJUSTMENT THEREOF WITH MULTIPLE ADJUSTMENT PARAMETERS

BACKGROUND OF THE INVENTION

Field of the Invention

The present invention concerns a method for performing an adjustment of a magnetic resonance (MR) system, and an associated MR system and non-transitory electronically readable data carrier that implement such a method.

Description of the Prior Art

Many MR methods, such as spectral fat suppression and fast imaging methods, such as EPI (Echo Planar Imaging) or imaging methods with spiral trajectories, place high demands on the homogeneity of the basic or polarization magnetic field B0 in the data acquisition scanner. The body of each patient individually locally deforms this field. In order to still be able to use the aforementioned methods, so-called "in vivo shimming" is performed for individual patients, i.e. the MR scanner is adjusted to the person being examined. First, the local B0 field is measured in the region to be investigated in order to generate a B0-map or basic field map, and then DC-offset currents for the three gradient coils and currents for special shim coils of an order higher than the first order are calculated by using the B0-map so that the local field distortions are optimally compensated. After setting these currents, usually in a frequency adjustment, an RF resonance frequency is ascertained for the desired spectral component of the investigated tissue (usually protons bound to water).

The fineness with which local B0-field inhomogeneities are compensated depends primarily on the number and order of the available (and useable) shim channels. In modern MR systems, the linear terms x, y, and z are usually generated by static offset currents of the three gradient coils. Due to the linear field pattern along the gradient direction, they are also known as shim channels of the first order.

Furthermore, many modern MR devices have dedicated shim coils. These shim coils are often constructed such that the fields generated thereby can be described by spherical harmonics. Shim channels of the second order include, for example, 5 shim coils, which generate fields with a spatial course that can be described in a good approximation by $z2$ (channel M4/A20), xz (channel M5/A21), yz (channel M5/A21), $x2-y2/2$ (channel M6/B21), xy (channel M8/B22).

Because the order of the corresponding spherical harmonics is usually limited, it is not possible to completely correct varying fields in the proximity of susceptibility interfaces quickly.

In multi-slice 2-D measurements, better results usually can be achieved with so-called dynamic shimming, in which the optimum DC offset and shim currents and an RF center frequency are individually calculated for each slice individually and the slices are converted before acquisition. However, due to longer settling times of some shim coils on current clinical devices, it is usually not possible for all shim channels to be used for dynamic shimming. In order to avoid a significant increase in the measurement time, with dynamic shimming often only the shim channels of the first order (gradients) and the RF center frequency are dynamically adjusted, hence during the duration of the sequence.

Because the course of the B0-inhomogeneities within a slice is not linear, it is usually still not possible to fully compensate for the B0-inhomogeneities within a slice even using dynamic shimming either.

Dynamic shimming can be traced back to the work of Blamire et al. (MRM 36 (1996) 159-165) and Morrell et al. (MRM 38 (1997) 477-483). Morrell et al. first perform a shim adjustment for the complete target volume. This therefore optimizes the shim currents for the complete target volume and also includes the shim channels that are later dynamically adjusted individually for the separate sub-target volume. Furthermore, the center frequency is optimized for the layer that is closest to the gradient isocenter. Then the B0-map is acquired and optimum linear shim terms and the center frequency are calculated for each layer (sub-target volume). Before the acquisition of each layer, optimized linear shim currents and the center frequency for this layer are set.

In general, the artifacts remaining after the in vivo adjustment increase with the basic field strength.

SUMMARY OF THE INVENTION

An object of the present invention is to avoid the above disadvantages and to provide an adjustment method that further improves the adjustment of an MR system to the person being examined.

According to the invention, a method for performing an adjustment is provided for an MR system under examination, from which MR images are to be generated, is divided into one or more excitation volumes. First adjustment parameters are determined in a processor for one of the excitation volumes of the object under examination. Furthermore, second adjustment parameters, which differ from the first adjustment parameters, are determined for this excitation volume of the object under examination. Then the scanner is operates to acquire first MR signals from the one excitation volume, using the first adjustment parameters. Furthermore, second MR signals are acquired from the one excitation volume, using the second adjustment parameters. Then a first MR image of the one excitation volume is generated with the use of the first measured MR signals, and a second MR image of the one excitation volume is generated with the use of the second measured MR signals.

Both the MR images of the excitation volume can be displayed so that the diagnosing physician has more information at his disposal. This increases the likelihood of being able to identify clinical abnormalities in the MR images that may otherwise be concealed by less-than-optimum adjustment of the B0 field. For example, the adjustment parameters can be selected such that the first adjustment parameters are optimized for a first sub-area of the excitation volume, while the second adjustment parameters are optimized for a second sub-area of the excitation volume, which at least partially differs from the first sub-area.

In an embodiment, the first MR image and the second MR image of the one excitation volume are superimposed to produce an overall image of the first excitation volume. Usually, this overall image has fewer remaining artifacts, due to the inhomogeneities of the B0 field, because the data for the MR images which were measured suitably often with the same adjustment parameters.

The first MR image and/or the second MR image can be corrected before the generation of the overall image, i.e. with regard to the influence due to the different adjustment parameters.

Preferably, the first adjustment parameters and the second adjustment parameters differ in terms of at least one of the following parameters: an RF center frequency, a current through one of the gradients and/or shim coils.

In an embodiment of the method, at least one excitation volume is divided into several sub-areas. After the excitation volume has been divided into at least two sub-areas, RF signals are transmitted into the excitation volume and first MR signals are received from the excitation volume. In this first measurement, during the transmission of the RF signals, and/or between transmission and reception of the MR signal, and/or during the reception of the first MR signals, the first adjustment parameters are applied. Afterwards, in a second measurement, RF signals are transmitted into the excitation volume and second MR signals are received. In this second measurement, during the transmission of the RF signals, and/or between transmission and reception of the second MR signal, and/or during the reception of the second MR signals, the second adjustment parameters are applied.

Furthermore, a field map can be ascertained that reproduces the inhomogeneities of the basic field B0 in the presence of the object under examination in the MR scanner within the excitation volume. With the use of this field map, a first remaining field map can be ascertained that represents residual inhomogeneities of the basic field B0 within the excitation volume after setting the first adjustment parameters. This first remaining field map can either be calculated using the field map and the first adjustment parameters, or measured by applying the first adjustment parameters during measurement. Accordingly, a second remaining field map can be ascertained that represents residual inhomogeneities of the basic field B0 within the excitation volume after setting the second adjustment parameters. Ascertainment takes place mathematically in turn using the field map and the second adjustment parameters or by means of measurement during which the second adjustment parameters are applied.

The first MR image calculated from the first MR signals and the second MR image calculated from the second MR signals of the excitation volume can be superimposed to produce an overall image.

This first remaining field map and/or the second remaining field map can then be used to generate the superimposed overall image. For example, the first MR image can be calculated from the first MR signals using the first remaining field map or a first intermediate image can first be calculated from the first MR signals which is then corrected with the use of the first remaining field map to generate the first MR image. Accordingly, the second MR image can be calculated from the second MR signals using the second remaining field map or a second intermediate image can first be calculated from the second MR signals which is then corrected with the use of the second remaining field map to generate the second MR image. Then the first and second MR image can be superimposed to produce an overall image.

The superimposing of the first and second MR images to produce an overall image can be implemented by assigning signal values from the first MR image to image points that are in the first sub-area of the excitation volume, while signal values from the second MR image are assigned to image points that are in the second sub-area. As a result, an overall image is obtained that has fewer artifacts overall than the first and second MR images individually. This is because the first MR image was calculated from the first MR signals that were measured using the first adjustment parameter, and this first adjustment parameter was ascertained so that the residual inhomogeneities of the basic field are optimally compensated in the first sub-area, and the second MR image was calculated from the second MR signals that were measured using the second adjustment parameters and this second adjustment parameter was ascertained so that the residual inhomogeneities of the basic field are optimally compensated in the second sub-area.

In superimposing the first and second MR image, image points in a boundary area between the first sub-area and the second sub-area can be assigned signal values that take into account both the signal values of the first MR image and the second MR image at the corresponding MR image point.

For example, the center frequency of the two adjustment parameters may differ. One center frequency is then used as a reference frequency, while for the other center frequency a difference frequency is calculated with respect to the reference frequency. A displacement of the image points is determined from the difference frequency in the corresponding MR image that was generated after application of the other adjustment parameters. The displacement is canceled before the two MR images are superimposed.

The aforementioned method is preferably used for recording MR signals with echo-planar imaging (EPI) technology. In MR images with this technology, an adjustment of the basic field to the person being examined is of particular significance as in the EPI sequence these inhomogeneities of the basic field lead to displacement of the pixels in the phase encoding direction. The displacement of a pixel depends on the deviation from the remaining inhomogeneity of the basic field at the site of the pixel and imaging parameter of the EPI sequence, for example, an echo interval (time between the acquisition of two phase code lines) and a physical field of view in the phase encoding direction. Usually, these imaging parameters are known. Furthermore, during the application of the first adjustment parameter the remaining inhomogeneity of the basic field within the excitation volume is reproduced by the first remaining field map ascertained according to the invention. In EPI, therefore, in calculating the first MR image from the first MR signals, a displacement correction can be performed according to the invention that cancels the calculated displacement pixel-by-pixel with the use of the first remaining field map and the known imaging parameters. Accordingly, in calculating the second MR image from the second MR signals, a displacement correction can be performed according to the invention that, with the use of the second remaining field map and the known imaging parameters, cancels the calculated displacement pixel-by-pixel.

The invention can also be used with other MR data acquisition technologies, particularly whenever good homogeneity of the basic field is necessary, as in the suppression of the fat signal with spectrally sensitive pulses or in MR imaging with spiral sequences.

The invention also concerns an MR apparatus having a scanner operated by a control computer so as to execute the above steps.

BRIEF DESCRIPTION OF THE DRAWINGS

FIG. 1 is a block diagram of an MR apparatus with which an adjustment can be performed according to the invention.

FIG. 2 shows a portion of a flowchart with steps for performing an adjustment of an MR system according to an embodiment of the invention.

FIG. 3 shows a further portion of the flowchart of FIG. 2 for performance of the adjustment.

FIG. 4 shows a further portion of the flowchart of FIG. 2 and for performance of the adjustment.

DESCRIPTION OF THE PREFERRED EMBODIMENTS

The present invention expands dynamic shimming by determining various adjustment parameters for at least one excitation layer. MR data from each layer are then acquired several times, with one of the adjustment parameters ascertained for these layers being respectively used in each case. The adjustment parameters can be an RF center frequency and/or static offset currents for the gradient coils of the system and/or currents for deduced shim coils of the system. First single images of the layer are calculated from the measurement data of each individual measurement. Then the single images can be corrected such that artifacts are compensated for as a result of the different shim settings or the different RF center frequency or are at least adjusted between the layers. In one embodiment, the corrected single images are superimposed to produce an overall image. Usually, this shows fewer remaining artifacts as a result of the B0 inhomogeneities than images that were measured correspondingly often using the same shim setting/RF center frequency in each instance. The correction to be performed before superimposition depends on the imaging technology used. With EPI, for example, the different shim settings/RF center frequencies produce different displacements in the phase encoding direction. In spite of multiple measurements, the invention does not necessarily result in an extension of the measurement time as when using EPI, wherein each layer is often measured several times to improve the signal-to-noise ratio (SNR) anyway.

One application of the invention is a full body examination with diffusion-weighted single-shot EPI. This technology is used clinically for screening metastases e.g. for therapy monitoring.

Apart from the distortions already mentioned, EPI may result in complete signal losses in areas of high magnetic susceptibility, if the field gradient becomes so large that the phase of the pixel along the field gradient varies by 2 PI or more. Furthermore, methods with high B0 sensitivity, such as the gradient reversal technique, can lead to fat suppression and to complete signal loss in areas with great absolute off-resonance.

FIG. 1 shows a block diagram of an MR apparatus with which, according to the invention, an improved adjustment of the MR system is achieved after a person being examined is moved into the tunnel of the scanner. The magnetic resonance scanner has a magnet 10 for generating a basic field B0, and a person being examined 12 is on a couch 11 and is moved into the center of the magnet 10. By radiating radio-frequency pulses into the person 12, and switching magnetic field gradients, the magnetization of nuclear spins of certain atoms or molecules in the person 12, generated by the basic field B0 is disturbed by deflecting the nuclear spins from their equilibrium position, and the currents induced in receiver coils (not shown) as the excited spins relax to the equilibrium position are converted into magnetic resonance signals. The general operation to generate MR images and the detection of magnetic resonance signals are known to those skilled in the art, so a more detailed explanation thereof is not necessary herein.

Furthermore, the magnetic resonance apparatus has an MR-control computer 13 that controls the MR scanner. The central MR control computer 13 has a gradient controller 14 to control and switch the magnetic field gradients and an RF controller 15 to control and emit the RF pulses that deflect the nuclear spins from the equilibrium position. In a memory 16, the imaging sequences necessary for acquiring the raw data for the MR images can be stored, as well as all the programs that are necessary for operating the MR apparatus. A recording controller 17 controls raw data acquisition and thus controls the sequence of the magnetic field gradient and RF pulses and the reception intervals of the MR signals as a function of the selected imaging sequences. The recording controller 17 therefore also controls the gradient controller 14 and the RF controller 15. In an image reconstruction processor 20, MR images are calculated that can be displayed on a display 18. An operator can operate the MR apparatus via an input interface 19. A data storage medium (not shown) is encoded with program codes and can be distributively loaded into one or more of the components of the control computer 13. Execution of the program code causes the method described below and above to be performed. The MR control computer is thereby configured to improve adjustment of the MR apparatus as explained in detail herein. In particular, the recording controller 17 can be designed to perform the adjustment described herein. The correction and superimposition of the MR images as explained hereinafter can be performed in the reconstruction processor 20.

The RF center frequency is treated herein as an adjustment parameter like a 0-order shim channel. This means a shim setting not only includes the values of the currents in the shim gradient coils of the scanner, but also the value of the RF center frequency. Two shim settings or adjustment parameters are different if they differ in value for at least one shim channel with respect to another shim channel, also when they only differ with regard to the RF center frequency.

First a basic field map is calculated that represents the local deviation of the actual field from the nominal B0-field of the system, as a B0-map $\Delta B0(x,y,z)$, or the local deviation of the resonance frequency of a spectral component of the tissue being examined is calculated as a frequency map $\Delta f0(x,y,z)$ within the area being examined. Details of how such maps are calculated are not relevant for the inventive method. Different methods are known for this purpose, inter alia, the method disclosed in DE 102014210778 A1.

The object of shimming is to determine with the B0-map shim currents and the RF center frequency such that the fields generated by the shim currents together with the selected RF center frequency optimally compensate for the field deviations reproduced by the field map within a target volume. The target volume is the sub-area of the area being examined in which the field deviations are to be minimized. Dynamic shimming essentially differs from conventional in vivo shimming in that with conventional in vivo shimming only a target volume for the entire area being examined is determined, while with dynamic shimming an individual (layer-specific) target volume is determined for each excitation volume (hence e.g. each layer of a 2-D sequence).

Usually, dynamic shimming is superior to conventional shimming because, the individual target volumes are smaller than the target volume determined for the entire area being examined in the case of conventional shimming. As a rule, the smaller the target volume, the better the available shim channels are able to compensate for the field deviations measured.

The inventive method differs from known dynamic shimming because, for each excitation volume, (hence, for example, for each layer) several different shim settings and/or different RF center frequencies (adjustment parameters) are determined. There is a multiplicity of options for ascertaining the various adjustment parameters:

In a first embodiment, each of the individual target volumes is divided into several sub-areas. Then a shim setting or a set of adjustment parameters is ascertained separately for each sub-area, optimally compensating for the field deviation within the sub-areas.

The sub-area in each case represents the target volume for the shim setting of the excitation volume to be ascertained. There are in turn a multiplicity of possibilities for determining the sub-areas. Thus e.g. the individual target volume can be divided into a central or peripheral area or the area limits can be selected where the field gradient is particularly great. Classification by a user (e.g. graphically) is also conceivable.

In all the embodiments, the sub-areas may also overlap.

In a further embodiment of the inventive method the division of the excitation volume into sub-areas does not necessarily occur. Rather, the shim currents are determined individually for each excitation volume and several RF center frequencies per excitation volume are determined.

Therefore, several adjustment parameter sets arise per excitation volume which only differ as a result of the RF center frequency (0-order shim channel). There are in turn a multiplicity of possibilities for determining the various RF center frequencies. For example, the remaining field deviation after setting the shim currents can be calculated for each pixel in the individual target volume of the excitation volume. This produces a histogram of field deviations. This histogram can then be used to determine RF center frequencies such that all or a certain percentage of the image points in the target volume can be measured in at least one of the repetitions with a low field deviation.

A first feature of the method is therefore that several different adjustment parameters (shim settings) are determined per excitation volume of the imaging sequence. A further feature of the method is that each layer (hence, each excitation volume) is measured several times and at least once using each of the different adjustment parameters.

In one embodiment, images are then first calculated from the data of each individual measurement, i.e. a first MR image is calculated from first MR data which is measured during the application of the first adjustment parameter, and a second MR image is calculated from second MR data which is measured during the application of the second adjustment parameter. In this way, several single images result from each excitation volume.

In another embodiment of the method, the various images of each excitation volume are directly displayed for the user (hence, for example, the physician making the diagnosis). Usually, each of the single images then represents an area of the excitation volume with particular precision, namely the area in which the respective shim setting has compensated for the B0 deviations particularly well. In a further embodiment, the single images of each excitation volume are superimposed to produce an overall image.

It must be taken into account that the different adjustment parameters can result in different artifacts in the single images. The nature of the artifacts depends on the respective sequences used for imaging and is explained hereinafter using the example of a Cartesian echo-planar sequence (EPI sequence for short). With EPI, each local deviation from the resonance frequency results in a displacement of the respective pixel in a phase encoding direction which is proportional to the field deviation. The proportionality constant can be calculated from the parameters of the EPI measurement.

As the single images are measured with different shim settings, the local deviation differs from the resonance frequency at the site of a certain pixel and thus also the respective distortion of the pixel in the single images. If the single images were superimposed by simply averaging the single images, the different displacements in the single images would result in a blurred overall image and with that, a loss of resolution.

Therefore, in a preferred embodiment the single images are corrected such that artifacts as a result of the different shim settings are compensated either absolutely or relatively to a reference setting.

In EPI, this correction can be implemented, for example, by first calculating a remaining field for each shim setting after setting the respective shim currents and the RF center frequency. This takes place such that the field contributions of the respective shim channels are added to the field map. With the use of this virtual field map, which reproduces the remaining field deviations after setting the shim channels, the distortions in the single image can then be corrected. The corrected single images are then superimposed.

However, simpler methods that manage without a knowledge of the remaining field are also conceivable. For example, in the embodiment in which only the RF center frequency between the settings is varied, a setting can be determined as a reference setting. For the other settings, a difference frequency is calculated from the RF center frequency of the respective setting and the RF center frequency of the reference setting. The respective difference frequency corresponds to a constant displacement of the single image vis-à-vis the reference image. Before superimposition the single image is shifted around this constant. The superimposed image therefore will continue to display distortions but blurring as a result of various distortions of the single images is avoided.

In the previous embodiment, higher-order shim channels can also be varied in relation to the reference setting, provided that the field path of the varied shim channel is known as a function of the shim current.

In a further variant, the single images are aligned with each other before superimposition with the aid of image processing methods, through so-called matching.

There are also various options for superimposing the single images after the individual correction of the single images: as aforementioned, in the simplest case superimposing takes place by means of averaging the single images. In particular, with EPI this approach is not optimal, however. Another special feature of EPI is that protons bound to fat molecules are displaced with respect to protons bound to water in a phase encoding direction. Therefore, with EPI a method for fat suppression is advantageous. Most of these methods, such as spectral fat suppression, SPAIR, gradient reversal and water excitation with spectral pulses are B0-sensitive. It must therefore be assumed that in areas of a single image in which the field deviation for the respective shim setting is high, fat suppression does not work and the fat phantom is visible. In an averaging of the single image, the fat phantom would be attenuated but not eliminated. In particular, in embodiments in which the excitation volume is divided into sub-areas, it may therefore be more favorable if only those single images with a shim setting which was optimized for the sub-area in which the pixel is located contribute to the signal of a pixel in the superimposed image. Usually, however, discontinuities of the signal then occur at the interfaces between the areas. These can be avoided or greatly attenuated by, for example, selecting partially overlapping sub-areas and when superimposing a pixel in the overlapping area, adding the single images which were measured in an optimized manner for one of the two areas.

An embodiment of the method according to the invention is described in connection with FIGS. 2-4. In FIG. 2, only one excitation volume of an imaging sequence is shown in each case. If there are several excitation volumes present—which is usually the case in 2-D imaging—these can be measured accordingly. As can be seen in FIG. 2, from the excitation volume of the following imaging sequence, here an EPI sequence, a basic field map is generated. This basic field map can, for example, be measured with a multi-echo gradient sequence with the same orientation but not necessarily the same layer thickness or pixel size. A method for how an absolute B0 field map can be generated from phase maps 20 of echoes with a different echo time is disclosed in the aforementioned DE 102014210778 A. In step 21, as described in DE 102014210778 A, post-processing may be necessary, for example, usually phase envelopes of 2Π must be removed to produce the basic field map 22. Furthermore, image points primarily containing noise must be excluded as no realistic basic field determination is possible here from the measurement data.

In step 23 the basic field map is then divided into several sub-areas corresponding to the sub-areas of the excitation volume. Two different sub-areas are used for a simplified exemplary embodiment. The basic field map 22 is therefore divided into one area 24 and one area 25, wherein in the exemplary embodiment of the area 24 shown there is a central area and the area 25 comprises the two peripheral areas of the excitation volume. Masking can be used here to separate the image points outside the area 24 or outside the area 25, leaving the two phase maps 24a and 25a, which respectively only has non-masked image points 24b from the area 24 an non-masked image points 25b from the area 25.

The phase maps 24a and 25a can be converted into a frequency map which reproduces the deviation of the local resonance frequency pixel-by-pixel from the system frequency during the acquisition of the basic field map. The frequency map can in turn be converted into a B0 map by means of $\Delta f(x,y,z)=(\gamma/(2\pi))\cdot\Delta B0(x,y,z)$. Therein, $\gamma/(2\pi)$ is the gyromagnetic ratio which amounts to 42.576 MHz/T for protons (hydrogen). Hereinafter, it is assumed that the maps 24/25 are available in the respective units used in the formulae without special explanation thereof.

In step 26a a first set of adjustment parameters can then be ascertained for the area 24. This first set of adjustment parameters comprises, for example, a frequency $\Delta f_0(1$, which indicates the change of the RF center frequency from the setting during the acquisition of the basic field map. Furthermore, the first set of adjustment parameters may contain gradient fields $\Delta Gx(1)$, $\Delta Gy(1)$, $\Delta Gz(1)$ for the three gradient coils which indicate the change of the gradient fields along the x, y, or z direction with respect to the setting during the acquisition of the B0 map.

To ascertain the first set of adjustment parameters for the sub-area 24, for each image point with coordinates (x,y,z) of the basic field map which is within the sub-area 24, the following equation (1) can be used:

$$-\Delta B_0(x, y, z) = \frac{2\pi}{\gamma}\Delta f_0^{(1)} + \Delta G_x^{(1)}(x-x_0) + \Delta G_y^{(1)}(1)(y-y_0) + \Delta G_z^{(1)}(1)(z-z_0) \quad (1)$$

Here $(x_0, y_0, z_0)$ is the coordinate of the isocenter of the gradient coils within the basic field map. The isocenter is the coordinate system origin.

As a whole, the equations (1) form an overdetermined linear equation system that can be solved using standard methods for ascertaining each of the four unknowns. $\Delta f0(1)$, $\Delta Gx(1)$, $\Delta Gy(1)$, $\Delta Gz(1)$ Step 26b proceeds accordingly to ascertain the adjustment parameters optimized for the sub-area 25. This means in short that the first adjustment parameter 27a (in the example $\Delta f0(1)$, $\Delta Gx(1)$, $\Delta Gy(1)$, $\Delta Gz(1)$) is ascertained for the first sub-area 24 and the second adjustment parameter 27b (in the example $\Delta f0(2)$, $\Delta Gx(2)$, $\Delta Gy(2)$, $\Delta Gz(2)$) for the second area 25.

The further steps are explained in FIG. 3. In step 30a and 30b, the B0 field contributions of the adjustment parameters for the shim channels ascertained in step 26a and 26b are added to the B0 field map pixel-by-pixel. This means that in step 30a, a first so-called remaining field map $\Delta B_0'^{(1)}(x,y,z)$ is generated, for which the following equation 2a applies:

$$\Delta B_0'^{(1)}(x, y, z) = \Delta B_0(x, y, z) + \frac{2\pi}{\gamma}\Delta f_0^{(1)} + \Delta G_x^{(1)}(x-x_0) + \Delta G_y^{(1)}(y-y_0) + \Delta G_z^{(1)}(z-z_0) \quad (2a)$$

and in step 30b a second remaining field map $\Delta B_0'^{(2)}(x,y,z)$ is generated, for which the following equation 2b applies:

$$\Delta B_0'^{(2)}(x, y, z) = \Delta B_0(x, y, z) + \frac{2\pi}{\gamma}\Delta f_0^{(2)} + \Delta G_x^{(2)}(x-x_0) + \Delta G_y^{(2)}(y-y_0) + \Delta G_z^{(2)}(z-z_0) \quad (2b)$$

This first remaining field map $\Delta B_0'^{(1)}$ (31a, 32a) reproduces the field deviation in the excitation volume after setting the first adjustment parameter. The first remaining field map can later be used for a distortion correction of the s using the first adjustment parameter measured first MR image.

Accordingly, the second remaining field map $\Delta B_0'^{(2)}$ (31b, 32b) reproduces the field deviation in the excitation volume after setting the second adjustment parameter. The second remaining field map can be used subsequently for a distortion correction of the second MR image measured using the second adjustment parameter.

With regard to FIG. 3, this means that the remaining field maps 32a and 32b are calculated.

FIG. 4 shows the approach to acquisition and reconstruction of image data.

Immediately before the first acquisition of image data in step 42 from the excitation volume considered, the first adjustment parameter intended for the first sub-area of the excitation volume in step 26a is set (step 41). Then, in step 42, first image data from the excitation volume is acquired. During the acquisition of the image data, the first adjustment parameters set in step 41 remain active, in particular, during the transmission of RF pulses and/or between the transmission of RF pulses and the reception of the first MR signal and/or during reception of the first MR signal.

Before a second acquisition of image data from the excitation volume considered, data from another excitation volume can be acquired. This is indicated by the box with the three points.

In step 43 the second adjustment parameters calculated for the second sub-area of the excitation volume are then set. In step 44, in turn, image data from the same excitation volume considered are then acquired. Then data from other excitation volumes can be measured again as indicated by step 45. If the excitation volume considered is measured more than twice, for example, in each second acquisition the second adjustment parameter can be set and otherwise, the first adjustment parameters. What is important is that each measurement is at least performed with each of the two adjustment parameter sets.

If there are several excitation volumes, it is possible to proceed accordingly for each of these excitation volumes. This means that for each excitation volume individual sub-areas can be determined and for each of these partial volumes a shim setting is calculated. The number and shape of the sub-areas between the excitation volumes may vary in principle.

The approach during the reconstruction of the MR images is shown on the right side of FIG. 4.

In the embodiment portrayed in FIG. 4, a first intermediate image 46a is first calculated from the first MR data measured in step 42. Accordingly, an intermediate image 46b is reconstructed from the second MR data measured in step 44. That is to say, in step 47a a distortion correction of the intermediate image 46a can be performed using the first remaining field map (31a, 32a) calculated in step 30a. The result is the equalized first MR image 48a. Accordingly, the intermediate image 46b can be equalized using the second remaining field map (31b, 32b) calculated in step 30b. The result is the equalized second MR image 48b.

In FIG. 4 the image data is first reconstructed conventionally to generate the intermediate images 46a and 46b and then a distortion correction is performed using the remaining field map 31a/32a or 31b/32b. However, it is also possible to use an algebraic method in which the information contained in the first remaining field map (31a, 32a) is already taken into consideration in the transformation of the first MR data acquired in step 42 into the image space.

Accordingly, with the use of the algebraic method the information contained in the second field map (31b, 32b) can already be taken into consideration in the transformation of the second MR data acquired in step 44 into the image space. With this algebraic method, distorted intermediate images 46a/46b are therefore not calculated but the corrected images 48a and 48b directly.

In step 49 the two images from the same excitation volume are superimposed to produce a final overall image 50. In the embodiment shown, a pixel of the superimposed image which is in the first sub-area 24 is assigned the pixel value of the corresponding pixel of the first MR image acquired using the first adjustment parameter set. Accordingly, a pixel which is in the second sub-area 25 is assigned the pixel value of the second MR image acquired using the second adjustment parameter set. In general, the number of such pixels which were so greatly dephased as a result of the remaining off-resonance that their signal is completely or partially lost is lower than in each of the two single images. Insofar as the images were acquired with a B0-sensitive method for fat suppression, generally speaking the superimposed image will also have fewer fat phantoms than the two single images. As a result of the distortion correction performed in step 47 a and b, adjacent pixels belonging to different sub-areas are not displaced against each other. In the aforementioned approach, the course of the intensity at the transition of the sub-areas may be discontinuous unless the distortion correction comprises any intensity correction.

These discontinuities can be avoided or reduced by assigning a gray value produced by a weighted average of the gray value of the corresponding pixels in the two superimposed images (48a and 48b) to a pixel in the superimposed image in the boundary area between sub-area 1 and 2:

$$I_{Superimposition}(x,y)=w_1(x,y)I_1(x,y)+w_2(x,y)I_2(x,y), \text{ with } w_1 \geq 0, w_2 \geq 0, w_1+w_2=1.$$

In the above equation, $I_1$ is the first MR image (48a) of the excitation volume measured using the first adjustment parameter, $I_2$ the second MR image (48b) of the excitation volume measured using the second adjustment parameter set and $I_{superimposition}$ the superimposed image of the considered excitation volume to be calculated in step 49.

The weighting factors w1 and w2 can be selected indirectly proportionally to the distance of the considered pixel from the boundary, hence, for example, for a pixel with the coordinates (x0,y0) which is in the sub-area 24 of the border area $$w1=0.5+|d|/D \quad w2=1-w1, \text{ for } (x_0,y_0) \in \text{sub-area } 1$$

In the above equation, $|d|$ is the distance of the point (x0, y0) from the boundary and D the extension of the boundary area. If, however, the pixel (x1, y1) is in the second sub-area 25 of the excitation volume, the following selection is valid:

$$w2=0.5+|d'|/D \quad w1=1-w2, \text{ for } (x1,y1) \in \text{sub-area } 2,$$
wherein $|d'|$ is the distance of the point $(x1,y1)$ from the boundary.

The inventive method differs from the dynamic shimming in the prior art, inter alia, in that for an excitation volume (hence, for example, for each layer of a 2-D measurement) several different shim settings or adjustment parameters are determined. A further feature is that the excitation volume is measured several times with different shim-settings. With dynamic shimming in the prior art, a one-time measurement is possible as only one shim setting is ascertained per excitation volume. In one embodiment, the different shim settings for an excitation volume are ascertained such that the excitation volume is divided into sub-areas. Each sub-area represents the target volume of one of the shim settings to be calculated. In general, the field path can be homogenized all the better with a given number of shim channels, the smaller the target volume is. Accordingly, the artifacts become fewer as a result of the remaining off-resonances. Each of the images of an excitation volume acquired with different shim settings should therefore have particularly few artifacts as a result of remaining off-resonances in the sub-area for which the respective shim setting was optimized. In particular, these artifacts should be fewer in the sub-area than in an image that, as in the prior art, was measured with a shim setting which was calculated for the greater target volume of the entire excitation area. In areas outside the respective sub-areas the remaining off-resonances and therefore the artifacts caused thereby may be greater. In a preferred embodiment, superimposing of the images measured with various shim settings is therefore performed to produce an overall image such that for one pixel in the superimposed image only or preferably the data of the image is used which was measured with a shim setting which is optimized for a sub-area in which the respective pixel is located. In order to avoid the superimposed image having any discontinuities at the area limits, the artifacts are corrected as a result of the remaining off-resonances before superimposition. The nature of the correction depends on the respective sequence technology. A clinical advantage is that certain methods sensitive to off-resonances, such as the aforementioned MR examination with diffusion-weighted single-shot EPI, which could not be used hitherto or only with a significant loss of image quality, produce a robust diagnostic image quality with the aid of the inventive method, regardless of the field strength of the device.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for adjusting a magnetic resonance (MR) scanner comprising:
    in a control computer that operates an MR scanner, determining first adjustment parameters for an excitation volume of an object to be examined with said MR scanner;
    in said control computer, determining second adjustment parameters for said excitation volume that differ from said first adjustment parameters;
    operating said MR scanner from said control computer to acquire first MR signals from the excitation volume using said first adjustment parameters to operate the MR scanner;
    operating said MR scanner from said control computer to acquire second MR signals from said excitation volume using said second adjustment parameters to operate the MR scanner,
    wherein the first MR signals and the second MR signals are acquired from regions associated with the same excitation volume;
    in an image reconstruction computer, generating a first MR image of the excitation volume from said first MR signals; and
    in said image reconstruction computer, generating a second MR image of said excitation volume from said second MR signals.

2. A method as claimed in claim 1 comprising, in said reconstruction computer, superimposing said first MR image and said second MR image to produce an overall image of said excitation volume.

3. A method as claimed in claim 2 comprising, before generating said overall image, correcting at least one of said first MR image or said second MR image with regard to an influence due to said first and second adjustment parameters being different.

4. A method as claimed in claim 1 comprising determining said first adjustment and said second adjustment parameters so as to differ by at least one of a center frequency of said excitation volume, a current through at least one gradient coil in said MR scanner, and a current through a shim coil in said MR scanner.

5. A method as claimed in claim 1 comprising dividing said excitation volume into at least two sub-volumes, and applying said first adjustment parameters to a first of said at least two sub-volumes and applying said second adjustment parameters to a second sub-volume of said at least two sub-volumes.

6. A method as claimed in claim 5 comprising reconstructing said overall image with image points in said first sub-volume being assigned signal values from said first MR image, and image points in said second sub-volume being assigned signal values from said second MR image.

7. A method as claimed in claim 6 comprising, when reconstructing said overall image, image points in a boundary area between said first sub-volume and said second sub-volume are assigned signal values dependent on both of said first and second MR images.

8. A method as claimed in claim 1 comprising, in a processor, also determining a field map that represents inhomogeneities of a basic magnetic field generated in said MR scanner in said examination volume of said object, and using said field map and said first adjustment parameters to determine a first remaining field map that represents residual inhomogeneities of said basic field within said excitation volume after setting said first adjustment parameters, and using said field map and said second adjustment parameters to determine a second remaining field map that represents residual inhomogeneities of said basic field within said excitation volume after setting said second adjustment parameters.

9. A method as claimed in claim 8 comprising reconstructing said first MR image using said first remaining field map, and reconstructing said second MR image using said second remaining field map.

10. A method as claimed in claim 9 comprising reconstructing said overall image with image points in said first sub-volume being assigned signal values from said first MR image, and image points in said second sub-volume being assigned signal values from said second MR image.

11. A method as claimed in claim 10 comprising, when reconstructing said overall image, image points in a boundary area between said first sub-volume and said second sub-volume are assigned signal values dependent on both of said first and second MR images.

12. A method as claimed in claim 9 comprising reconstructing said first MR image to include a distortion correction made using said first remaining field map, and reconstructing said second MR image to include a displacement correction determined to using said second remaining field map.

13. A method as claimed in claim 1 comprising operating said MR scanner to obtain said first and second MR signals using an echo planar imaging sequence.

14. A magnetic resonance (MR) apparatus comprising:
    an MR data acquisition scanner;
    a control computer configured to:
        operate said MR scanner, said control computer being configured to determine first adjustment parameters for an excitation volume of an object to be examined with said MR scanner;
        determine second adjustment parameters for said excitation volume that differ from said first adjustment parameters to operate the MR scanner;
        operate said MR scanner to acquire first MR signals from the excitation volume using said first adjustment parameters to operate the MR scanner; and
        operate said MR scanner to acquire second MR signals from said excitation volume using said second adjustment parameters,
    wherein the first MR signals and the second MR signals are acquired from regions associated with the same excitation volume; and
    an image reconstruction computer configured to:
        generate a first MR image of the excitation volume from said first MR signals; and
        generate a second MR image of said excitation volume from said second MR signals.

15. A non-transitory, computer-readable data storage medium encoded with programming instructions, said storage medium being loaded into a computer system of a magnetic resonance (MR) apparatus that includes an MR data acquisition scanner, said programming instructions causing said computer system to:
- determine first adjustment parameters for an excitation volume of an object to be examined with said MR scanner;
- determine second adjustment parameters for said excitation volume that differ from said first adjustment parameters;
- operate said MR scanner to acquire first MR signals from the excitation volume using said first adjustment parameters to operate the MR scanner;
- operate said MR scanner to acquire second MR signals from said excitation volume using said second adjustment parameters to operate the MR scanner,
- wherein the first MR signals and the second MR signals are acquired from regions associated with the same excitation volume;
- generate a first MR image of the excitation volume from said first MR signals; and
- generate a second MR image of said excitation volume from said second MR signals.

16. A method as claimed in claim 1, wherein the first adjustment parameters and the second adjustment parameters correspond to at least one excitation layer in accordance with a dynamic shimming operation associated with the MR scanner.

17. A method as claimed in claim 1, wherein the acts of operating the MR scanner to acquire the first MR signals from the excitation volume using the first adjustment parameters and operating the MR scanner to acquire the second MR signals from the excitation volume using the second adjustment parameters occur sequentially.

18. A method as claimed in claim 1, wherein the first MR image and the second MR image correspond to regions associated with the same excitation volume, and
- wherein the first MR image and the second MR image have a first and a second sub-region associated with the acquisition of the first MR signals in accordance with the first adjustment parameters and the acquisition of the second MR signals in accordance with the second adjustment parameters, respectively.

* * * * *